(12) United States Patent
Yang et al.

(10) Patent No.: US 9,823,775 B2
(45) Date of Patent: Nov. 21, 2017

(54) TOUCH SCREEN AND METHOD OF MANUFACTURING THE SAME, DISPLAY PANEL AND DISPLAY DEVICE

(71) Applicants: BOE Technology Group Co., Ltd., Beijing (CN); Chengdu BOE Optoelectronics Technology Co., Ltd., Sichuan (CN)

(72) Inventors: Huiguang Yang, Beijing (CN); Gang Zhou, Beijing (CN); Haoyuan Fan, Beijing (CN); Yanxia Xin, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 0 days.

(21) Appl. No.: 15/207,778

(22) Filed: Jul. 12, 2016

(65) Prior Publication Data
US 2017/0123559 A1    May 4, 2017

(30) Foreign Application Priority Data

Nov. 3, 2015    (CN) .......................... 2015 1 0737169

(51) Int. Cl.
*G06F 3/041* (2006.01)
*G03F 7/20* (2006.01)
*G03F 7/32* (2006.01)

(52) U.S. Cl.
CPC .............. *G06F 3/0416* (2013.01); *G03F 7/20* (2013.01); *G03F 7/32* (2013.01); *G06F 3/0412* (2013.01); *G06F 2203/04103* (2013.01)

(58) Field of Classification Search
CPC .... G03F 7/20; G03F 7/32; G06F 2203/04103; G06F 3/0412; G06F 3/0416
See application file for complete search history.

(56) References Cited

U.S. PATENT DOCUMENTS

| | | | |
|---|---|---|---|
| 8,346,048 B2* | 1/2013 | Bita ..................... | G02B 6/0038 359/291 |
| 8,810,528 B2* | 8/2014 | Bita ..................... | G02B 6/0055 345/173 |
| 2009/0296193 A1* | 12/2009 | Bita ..................... | G02B 6/0038 359/291 |

(Continued)

*Primary Examiner* — Dmitriy Bolotin
(74) *Attorney, Agent, or Firm* — Westman, Champlin & Koehler, P.A.

(57) ABSTRACT

The present invention relates to display technology field and particularly to a touch screen and a method of manufacturing the same, a display panel and a display device. The touch screen includes an insulating layer and a touch-controlling electrode. The insulating layer is provided with at least one recess structure in a side thereof and the touch-controlling electrode is arranged in the recess structure, a cross section area of the touch-controlling electrode in a direction perpendicular to a touch face of the touch screen being larger at a position corresponding to the top of the at least one recess structure than at a position corresponding to the bottom of the at least one recess structure. The touch screen eliminates adverse influence of the pattern of touch-controlling electrode on the display while ensuring the touch-controlling effect.

16 Claims, 5 Drawing Sheets

(56) References Cited

U.S. PATENT DOCUMENTS

| | | | | |
|---|---|---|---|---|
| 2011/0157093 A1* | 6/2011 | Bita | ..................... | G02B 6/0055 |
| | | | | 345/175 |
| 2013/0127784 A1* | 5/2013 | Martin | ................. | G02B 26/001 |
| | | | | 345/175 |
| 2014/0028925 A1* | 1/2014 | Choi | ................... | G02F 1/13338 |
| | | | | 349/12 |
| 2016/0300732 A1* | 10/2016 | Hosomomi | ......... | H01L 21/4825 |

* cited by examiner

TOUCH SCREEN AND METHOD OF MANUFACTURING THE SAME, DISPLAY PANEL AND DISPLAY DEVICE

CROSS-REFERENCE TO RELATED APPLICATIONS

This application claims priority of Chinese Patent Application No. 201510737169.X, filed Nov. 3, 2015, entitled "touch screen and method of manufacturing the same, display panel and display device", which is incorporated herein by reference in its entirety.

BACKGROUND OF THE INVENTION

Field of the Invention

The present invention relates to field of display technology, and particularly to a touch screen and a method of manufacturing the same, a display panel and a display device.

Description of the Related Art

Due to its sensitive touch response and ability of multiple-points touch control, a touch screen may provide admirable vision and tactual enjoyment.

For producing a thin and light touch screen, structures, in which a touch panel is integrated to a display screen, are provided, for example, including an "In-cell" structure and an "On-cell" structure. The "In-cell" structure is directed to a structure where the touch screen is embedded into a display screen. The "On-cell" structure is directed to a structure where the touch screen is embedded on exterior of a display screen.

Figure 1:
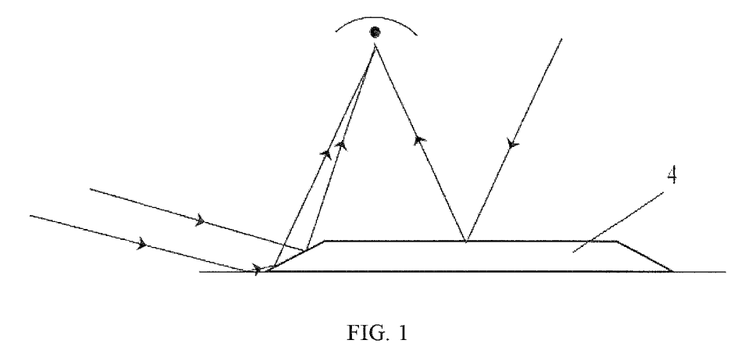
FIG. 1 is a schematic view of a pattern of touch-controlling circuit in a touch screen in prior arts.

The touch-controlling circuit of the "On-cell" structure currently is classified as a single-film type and a multi-film type, and the single-film touch-controlling circuit structure is popularized due to a lower cost. In a single-film touch-controlling circuit structure, as shown in FIG. 1, a touch-controlling circuit 4 is usually made of a transparent conductive material. However, as a cross section of the touch-controlling circuit 4 faces towards a displaying side and a tilted cross section of the touch-controlling circuit 4 at edge thereof has a light reflection surface facing towards a person's eyes that may reflect light to his/her eyes. Thus, a pattern of the touch-controlling circuit will be viewed and thus display performance of the display screen will be degraded.

SUMMARY OF THE INVENTION

Embodiments of the present invention aim to problems and shortages in prior arts and thus provide a touch screen and a method of manufacturing the same, a display panel and a display device, enabling elimination of the adverse influence of the pattern of touch-controlling electrode on the display effect of the display screen while ensuring the touch-controlling effect.

To solve the problem, a touch screen is provided, including an insulating layer and a touch-controlling electrode, wherein the insulating layer is provided with at least one recess structure in a side thereof and the touch-controlling electrode is arranged in the recess structure, and a cross section area of the touch-controlling electrode taken in a direction perpendicular to a touch face of the touch screen is larger at a position corresponding to the top of the at least one recess structure than at a position corresponding to the bottom of the at least one recess structure.

In an embodiment, the touch-controlling electrode has a cross section in a reverse-trapezoid shape in the direction perpendicular to the touch face of the touch screen, the reverse-trapezoid shape having an included angle $\alpha$ at its bottom side that is ranged from 90° to 180°.

In an embodiment, the touch-controlling electrode has a thickness smaller than or equal to a thickness of the insulating layer and an upper surface of the touch-controlling electrode is flush with an upper surface of the insulating layer.

In an embodiment, the touch-controlling electrode has a thickness in a range from 500 Å to 2000 Å.

In an embodiment, the touch-controlling electrode is made of a transparent conductive material, and the transparent conductive material includes tin indium oxide.

In an embodiment, the insulating layer is made of a transparent insulation material which includes an organic resin material; or, the insulating layer is made of transparent glass.

A method of manufacturing a touch screen includes: forming an insulating layer and a touch-controlling electrode; wherein, the step of forming an insulating layer and a touch-controlling electrode comprises:

forming at least one recess structure in a side of the insulating layer; and forming the touch-controlling electrode in the at least one recess structure;

wherein a cross section area of the touch-controlling electrode taken in a direction perpendicular to a touch face of the touch screen is larger at a position corresponding to the top of the at least one recess structure than at a position corresponding to the bottom of the at least one recess structure.

In an embodiment, the method includes:

forming the insulating layer, and forming the at least one recess structure in the insulating layer through a patterning process;

forming a film of electrically conductive layer on the insulating layer having the at least one recess structure;

forming a photoresist layer on the film of electrically conductive layer and performing a patterning process on the photoresist layer such that a portion of the photoresist layer located in a region corresponding to the recess structure is remained;

performing a patterning process on the film of electrically conductive layer such that a portion of the film of electrically conductive layer located in the recess structure is remained so as to form the touch-controlling electrode.

In an embodiment, the insulating layer is made of transparent insulation material which includes organic resin material.

In an embodiment, the method comprises:

forming a photoresist layer on an upper surface of the substrate, and removing, through a patterning process, a portion of the photoresist layer in a region corresponding to the touch-controlling electrode to be formed;

forming the recess structure in a region of the substrate where no photoresist layer covers through a patterning process;

forming a film of electrically conductive layer over the substrate having the at least one recess structure;

peeling off residue portions of the photoresist layer left on the substrate and a portion of the film of electrically conductive layer located on the photoresist layer through an ashing process such that a portion of the film of electrically conductive layer in the recess structure is remained so as to form the touch-controlling electrode.

In an embodiment, the touch-controlling electrode has a cross section in a reverse-trapezoid shape in the direction perpendicular to the touch face of the touch screen, the reverse-trapezoid shape having an included angle α at its bottom side that is ranged from 90° to 180°.

In an embodiment, the touch-controlling electrode has a thickness smaller than or equal to a thickness of the insulating layer and an upper surface of the touch-controlling electrode is flush with an upper surface of the insulating layer.

In an embodiment, the touch-controlling electrode has a thickness in a range from 500 Å to 2000 Å.

In an embodiment, the film of electrically conductive layer is made of a transparent conductive material, which includes tin indium oxide.

A display panel includes a display screen, wherein the display panel further comprises the touch screen as described above, the touch screen being disposed at a displaying side of the display screen.

A display device includes the display panel as described above.

In the drawings, the reference numbers are denoted as below:

11—insulating layer; 110—insulating layer; 12—touch-controlling electrode; 120—electrically conductive layer; 2—display screen; 3—photoresist material; 30—photoresist layer; 4—touch-controlling circuit.

DETAILED DESCRIPTION OF PREFERRED EMBODIMENTS OF THE INVENTION

A touch screen and a method of manufacturing the same, a display panel and a display device of the present invention will be further described in detailed with reference to embodiments and accompanying drawings, in order to make the object, schemes and advantages of the present invention more clear.

Figure 2:
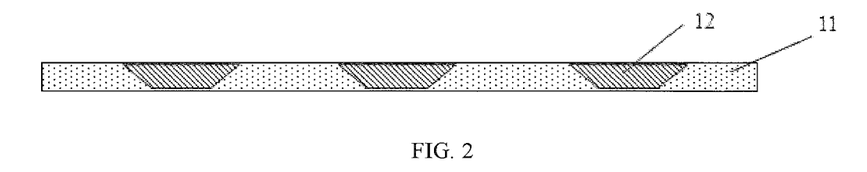
FIG. 2 is a schematic partial cross section view of a touch screen according to embodiment 1.

An embodiment provides a touch screen, which may ensure touch controlling effect while eliminating adverse impact on display performance of the display screen due to a pattern of the touch-controlling electrode. As shown in FIG. 2, the touch screen includes an insulating layer 11 and a touch-controlling electrode 12, wherein the insulating layer is provided with at least one recess structure in a side thereof and the touch-controlling electrode 12 is arranged in the recess structure. A cross section area of the touch-controlling electrode in a direction perpendicular to a touch face of the touch screen is larger at a position corresponding to a top of the at least one recess structure than at a position corresponding to a bottom of the at least one recess structure. Herein, the touch face means an upper surface of the touch screen, of which a corresponding function area is touched by a finger of a person or other item having electrostatic induction to make the touch screen to response to corresponding function, thereby achieving control of corresponding function.

In an embodiment, the touch-controlling electrode 12 has a cross section in a reverse-trapezoid shape in the direction perpendicular to the touch face of the touch screen and the reverse-trapezoid shape has an included or internal angle α at its bottom side away from the touch face, which angle is ranged from 90° to 180°. That is, the included angle α formed by an upper surface of a transparent electrically conductive layer and an upper surface of the transparent insulating layer 11 is larger than 90°.

In FIG. 2, the touch-controlling electrode 12 has a thickness smaller than or equal to a thickness of the insulating layer 11 and an upper surface of the touch-controlling electrode 12 is flush with the upper surface of the insulating layer 11. Preferably, the touch-controlling electrode 12 has a thickness equal to a thickness of the insulating layer 11. Further, preferably, the touch-controlling electrode 12 has a thickness in a range from 500 Å to 2000 Å.

In the embodiment of the touch screen, the touch-controlling electrode 12 is made of a transparent conductive material, which includes tin indium oxide. In addition, the insulating layer 11 is made of a transparent insulation material, which includes organic material.

In the embodiment of the touch screen, a single layer of touch-controlling circuit pattern is filled into the reverse-trapezoid recess structure in the insulating layer 11 having a certain pattern to form the touch-controlling electrode with a reverse-trapezoid cross section such that the upper surface of the insulating layer 11 and the upper surface of the touch-controlling electrode 12 are flush with each other, thereby avoiding separation of a portion of the electrode layer exposed above the insulating layer for the sake that the upper surface of the touch-controlling electrode 12 exceeds that of the insulating layer, and also avoiding a situation where the insulating layer reflects light if the upper surface of the touch-controlling electrode is lower than the upper surface of the insulating layer.

It is appreciated that a touch screen is generally attached to a surface of a display screen and cooperates with the display screen to achieve human-machine interaction. As for a touch screen in the on-cell structure, the touch screen may include a substrate configured for supporting the insulating layer 11 and the touch-controlling electrode 12. The substrate may be configured as a separate transparent layer, or may be the substrate of the display screen.

Figure 3:
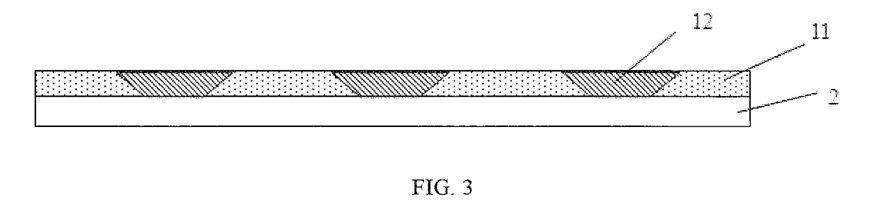
FIG. 3 is a schematic partial cross section view of a display panel according to embodiment 1.

As shown in FIG. 3, an embodiment provides a display panel, which includes a display screen 2 and the above touch screen. The touch screen is arranged at displaying side of the display screen 2. In the embodiment, the display screen 2 may be a liquid crystal display (LCD) or an organic light emission display (OLED). The liquid crystal display has a basis structure including an array substrate, a color filter substrate and a liquid crystal (LC) layer filled into a space between the array substrate and the color filter substrate. The insulating layer 11 and the touch-controlling electrode 12 of the touch screen may be formed on an upper surface of the color filter substrate of the liquid crystal display screen. Specifically, the insulating layer 11 having a certain pattern is formed on the color filter substrate of the liquid crystal display screen and the touch-controlling electrode 12 is formed in the insulating layer 11.

Accordingly, an embodiment provides a method of manufacturing a touch screen, including a step of forming an insulating layer and a touch-controlling electrode. In this method, the step of forming the insulating layer and the touch-controlling electrode includes a step of forming at least one recess structure in a side of the insulating layer and a step of forming the touch-controlling electrode in the recess structure. In an embodiment of the present invention, a cross section area of the touch-controlling electrode taken in a direction perpendicular to a touch face of the touch screen may be larger at a position corresponding to a top of the at least one recess structure than at a position corresponding to a bottom of the at least one recess structure.

Before describing the method, it is noted that in the present invention, a patterning process may only include a lithographic process, or, may include a lithographic process and an etching process, or may further include a printing process, an ink injection process, or other process for forming a preset pattern. The lithographic process means a process of forming a pattern by means of photoresist, mask or exposure machine, including processes of film formation, exposure, development, and the like. A corresponding patterning process may be selected depending on a structure to be formed in the present invention.

Figure 4:
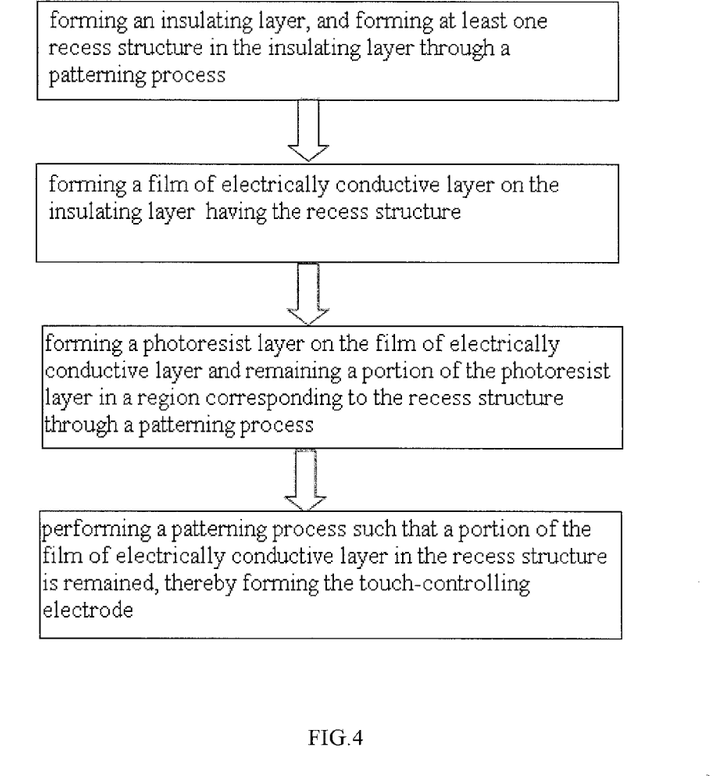
FIG. 4 is a flow chart of manufacturing the touch screen shown in FIG. 2.

As shown in FIG. 4, an example is provided, in which the touch screen is formed at a side of the display screen 2. The method of manufacturing a touch screen includes:

Step 1): forming an insulating layer, and forming at least one recess structure in the insulating layer through a patterning process.

Figure 5A:
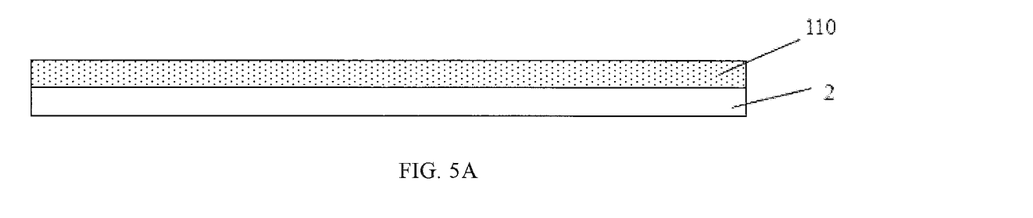
FIGS. 5A-5F are cross section views of the structure of the touch screen shown in FIG. 2 during manufacturing process.
Figure 5B:
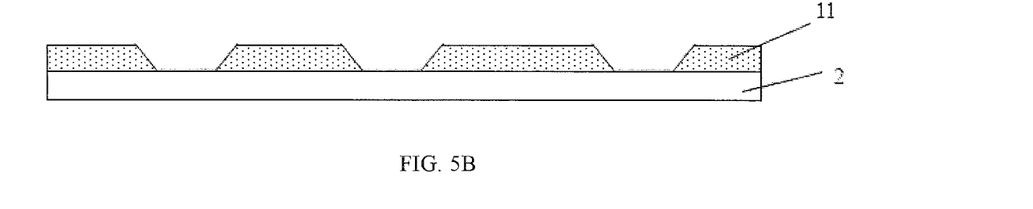

In this step, a film of insulating layer 110 is firstly formed as shown in FIG. 5A, for example through a coating process; and then, the recess structure is formed in the film of insulating layer 110 as shown in FIG. 5B, thereby forming the insulating layer 11. In an embodiment, the film of insulating layer 110 is made of a transparent insulation material and the transparent insulation material includes organic resin material. For example, a film of transparent organic resin material may be coated on the color filter substrate of the liquid crystal display screen, and a reverse-trapezoid recess structure having a pattern is formed by the film of the transparent organic resin material by exposure and development processes.

Step 2): forming a film of electrically conductive layer on the insulating layer 110 having the recess structure.

Figure 5C:
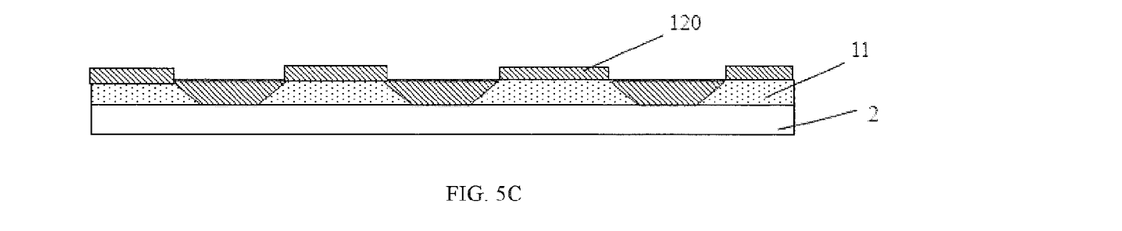

In this step, as shown in FIG. 5C, a film of electrically conductive layer 120 is formed on the insulating layer 11 having the reverse-trapezoid recess structure. The film of electrically conductive layer 120 is made of a transparent electrically conductive material. The transparent electrically conductive material includes tin indium oxide material (ITO).

Step 3): forming a photoresist layer on the film of electrically conductive layer and remaining a portion of the photoresist layer in a region corresponding to the recess structure through a patterning process.

Figure 5D:
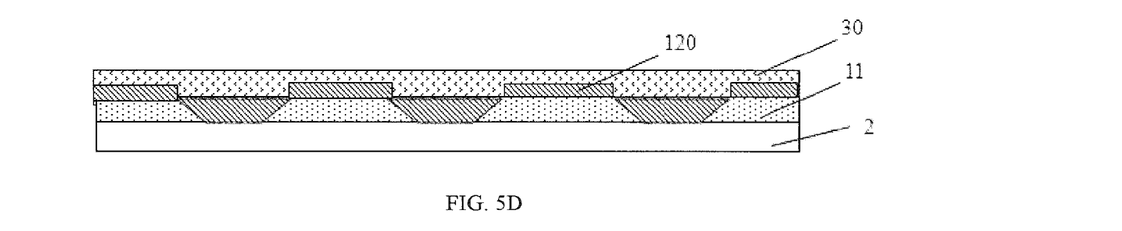
Figure 5E:
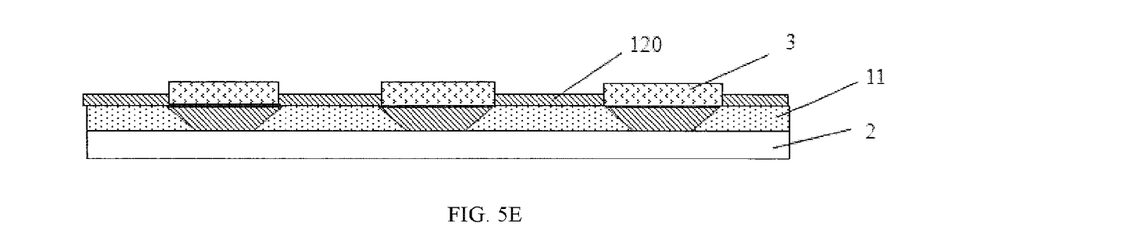

In this step, a photoresist layer 30 is formed on the film of electrically conductive layer 120 as shown in FIG. 5D, and is processed through exposure and development processes such that the portion 3 of the photoresist layer 30 in a region corresponding to the recess structure is remained, as shown in FIG. 5E.

Step 4): performing a patterning process such that a portion of the film of electrically conductive layer in the recess structure is remained, thereby forming the touch-controlling electrode 12.

Figure 5F:
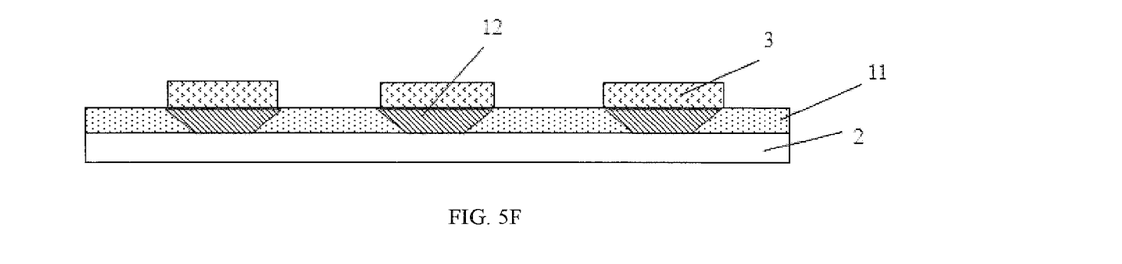

In this step, as shown in FIG. 5F, a pattern of the touch-controlling electrode 12 in the recess structure is formed through etching process and the touch-controlling electrode 12 has a reverse-trapezoid cross section. That is, the touch-controlling electrode 12 has a cross section in a reverse-trapezoid shape in a direction perpendicular to a touch face of the touch screen and the reverse-trapezoid shape has an included angle α at its bottom side that is ranged from 90° to 180°.

The touch-controlling electrode 12 has a thickness smaller than or equal to a thickness of the insulating layer 11 and an upper surface of the touch-controlling electrode 12 is flush with an upper surface of the insulating layer 11. In an embodiment, the touch-controlling electrode 12 has a thickness in a range from 500 Å to 2,000 Å.

In another embodiment, the transparent insulating layer may be exposed and developed by a grey scale exposure technology such that the formed transparent insulating layer has a thickness greater than the thickness of the touch-controlling electrode and then the portion of the transparent insulating layer higher the touch-controlling electrode in the pattern and a residue portion of the film of the electrically conductive layer thereon are removed by an ashing process, thereby forming the desired structure of the touch-controlling electrode and reducing the number of patterning processes by one.

Figure 9:
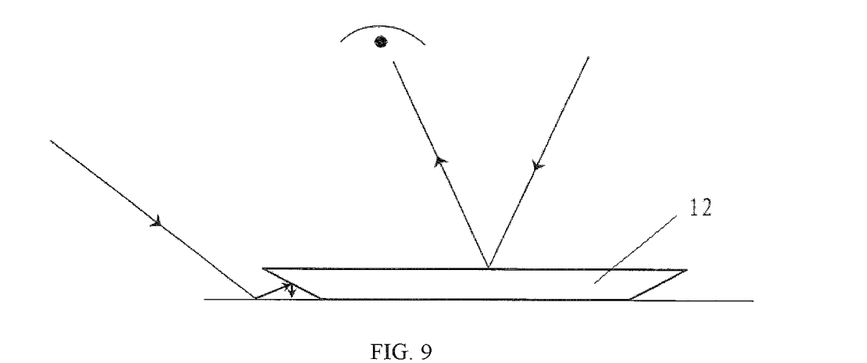
FIG. 9 is a schematic view of a touch-controlling electrode in a touch screen according to the present invention, in which light reflection at edge of the pattern of touch-controlling electrode is eliminated.

In the touch screen of the embodiment, the material of the insulating layer 11 and the touch-controlling electrode 12 are alternately distributed, or in other words, the material of the insulating layer 11 is distributed in gaps of the pattern of the touch-controlling electrode 12. As shown in FIG. 9, the touch-controlling electrode 12 is configured to have a reverse-trapezoid structure such that a tilted section of the touch-controlling electrode reflects light backwards in a direction facing away from eyes of a person, which prevents reflection of visible light from a section of a film of a circuit layer facing directly to eyes of a person, that is, thereby solving problem in prior art that a titled section face of the touch-controlling electrode reflects visible light to person's eyes and thus the pattern of the electrically conductive circuit is visible.

An embodiment of the present invention provides a touch screen, which can effectively eliminate light reflection of the touch-controlling electrode and thereby overcome adverse influence on display performance of the display screen due to the pattern of the touch-controlling electrode so as to ensure display performance while maintaining touch-controlling effect of the touch screen.

Figure 6:
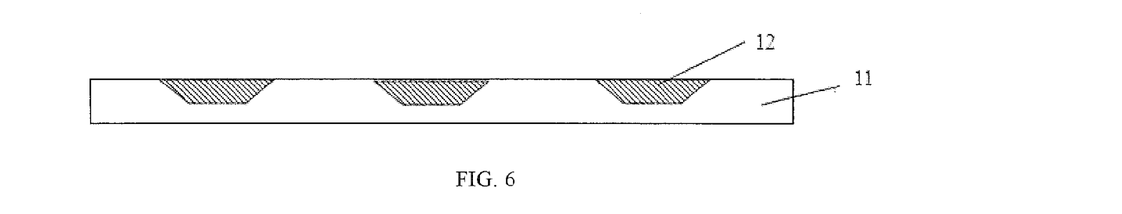
FIG. 6 is a structural schematic view of a touch screen according to embodiment 2 of the present invention.

Compared with the touch screen in the embodiment, the insulating layer 11 of the touch screen in the embodiment as shown in FIG. 6 is a transparent substrate. For example, a glass substrate of the display screen 2 adjacent to a displaying side may directly be used as the insulating layer 11. In this instance, the touch screen is provided by directly forming the reverse-trapezoid recess structure having a certain pattern in a side of the substrate at displaying side of the display screen. For example, in a liquid crystal display screen as an example, a film of electrically conductive layer may be formed on a color filter substrate and a pattern of a touch-controlling electrode may be formed in a recess structure in the color filter substrate by exposure, development and etching processes.

Accordingly, the embodiment further provides a display panel including a display screen and the touch screen as described above, in which the touch screen is disposed on a displaying side of the display screen.

In the embodiment of the display panel, in which display screen is a liquid crystal display screen, a touch-controlling electrode may be formed on an upper surface of a color filter substrate at a displaying side of the liquid crystal display screen.

Figure 7:
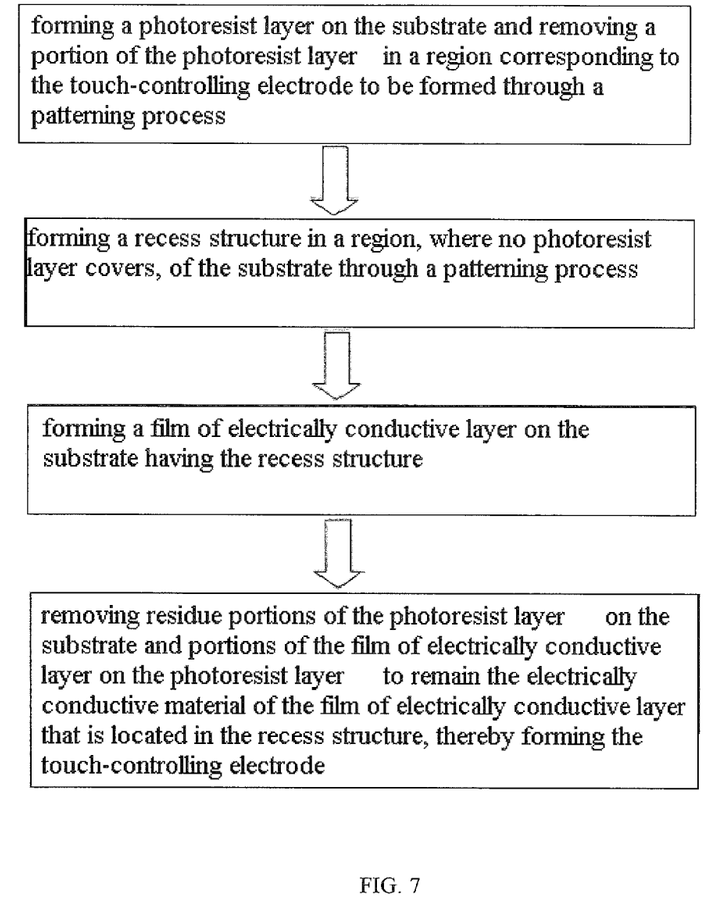
FIG. 7 is a flow chart of manufacturing the touch screen in FIG. 6.

As shown in FIG. 7, a method of manufacturing the touch screen includes:

Step 1): forming a photoresist layer on the substrate and removing a portion of the photoresist layer 3 in a region corresponding to the touch-controlling electrode to be formed through a patterning process.

Figure 8A:
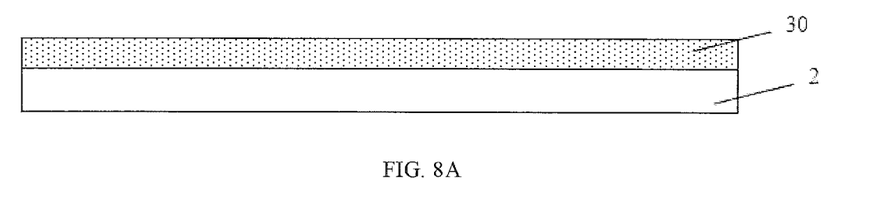
FIG. 8A-8D are cross section views of the structure of the touch screen in FIG. 6 during manufacturing process.
Figure 8B:
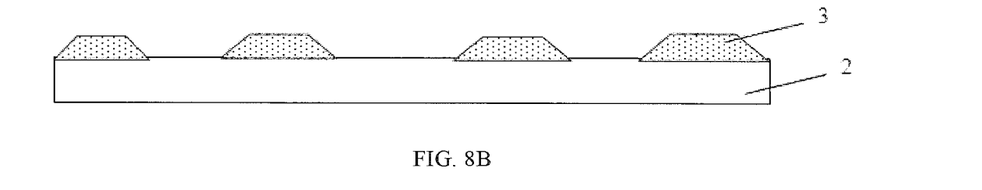

In the step, a photoresist layer 30, is formed on the substrate on a displaying side of the display screen 2 as shown in FIG. 8A, and a recess structure will be then formed using the photoresist layer 30 as shown in FIG. 8B.

Step 2): forming a recess structure in a region, where no photoresist layer covers, of the substrate through a patterning process.

Figure 8C:
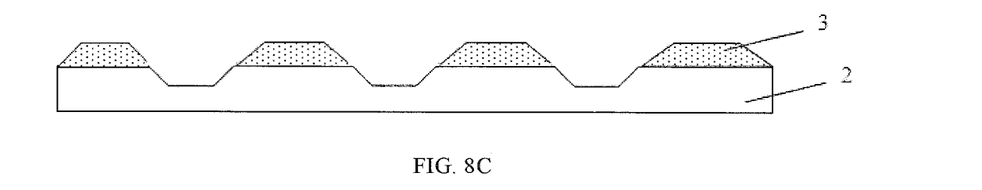

In this step, as shown in FIG. 8C, a reverse-trapezoid recess structure having a certain pattern is formed in an upper surface of the color filter substrate of the liquid crystal display screen by using a substrate etching liquid to etch surface of the substrate. For example, a mined acid solution (which may include hydrofluoric acid, sulfuric acid, hydrochloric acid, $NH_4HF_2$, etc.), whose main component is hydrofluoric acid, is used as the substrate etching liquid to etch the substrate.

Step 3): forming a film of electrically conductive layer on the substrate having the recess structure.

Figure 8D:
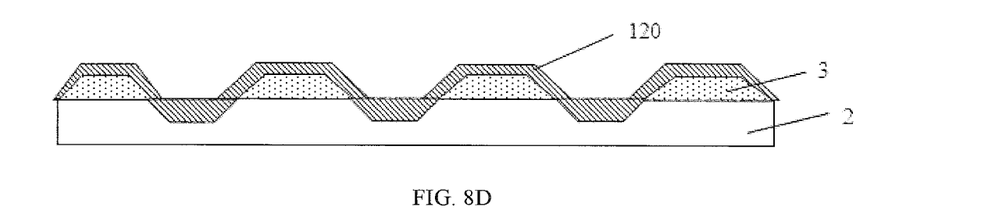

In the step, as shown in FIG. 8D, a film of electrically conductive layer 120 is formed in the reverse-trapezoid recess structure such that the film of electrically conductive layer 120 is filled into interior of the recess structure in a natural state. The film of electrically conductive layer 120 is made of a transparent electrically conductive material and the transparent electrically conductive material includes tin indium oxide material.

Step 4): removing residue portions of the photoresist layer 30 on the substrate and portions of the film of electrically conductive layer on the photoresist layer 30 to remain the electrically conductive material of the film of electrically conductive layer that is located in the recess structure, thereby forming the touch-controlling electrode.

In the step, the photoresist layer and the portion of the film of electrically conductive layer 120 on the photoresist layer are removed to remain the portion of the film of electrically conductive layer 120 in the recess structure, so as to form the reverse-trapezoid touch-controlling electrode 12.

In an embodiment, the substrate may be provided thereon with an insulating layer in advance. In this instance, the photoresist layer is formed on the insulating layer. In the embodiment, the step of forming the recess structure in the substrate is changed as a step of forming the recess structure in the insulating layer on the substrate. Finally, the film of electrically conductive layer is formed in the recess structure in the insulating layer on the substrate. Thus, the touch-controlling electrode is formed in the recess structure in the insulating layer on the substrate.

The touch screens in the above embodiments do not cause light reflection in the display screen when displaying while ensuring touch-controlling effect. Meanwhile, compared with the process of manufacturing a single-layer film of touch-controlling electrode in prior arts, the methods of manufacturing the touch screen in the embodiments do not involve additional mask and may be implemented using one time pattering process and thus lead to higher yield due to developed patterning process.

The touch screens and the methods of manufacturing the same in the embodiment 1 and embodiment 2 may be flexibly implemented according to costs and implementing conditions.

Another embodiment of the present invention provide a display device, including the display panel according to the above embodiments.

The display device may be a liquid crystal display panel, an electrical paper, an OLED panel, a mobile phone, a tablet computer, a Television, a display, a notebook computer, a digital photo frame, a navigator or other product or component that has a display function.

The display device may ensure good display performance as it is provided with the above display panel.

It is understood that the above embodiment are exemplary embodiments that are provided to only describe principle of the invention. However, the present invention is not limited to this. Any modification, equivalent, improvement, etc. made within the spirits and principle of the present invention, of the embodiments of the present invention should be included in the protective scope of the invention.

The invention claimed is:

1. A touch screen, comprising an insulating layer and a touch-controlling electrode, wherein the insulating layer is provided with at least one recess structure in a side thereof and the touch-controlling electrode is arranged in the recess structure, and a cross section area of the touch-controlling electrode taken in a direction perpendicular to a touch face of the touch screen is larger at a position corresponding to the top of the at least one recess structure than at a position corresponding to the bottom of the at least one recess structure, wherein the touch-controlling electrode has a cross section in a reverse-trapezoid shape in the direction perpendicular to the touch face of the touch screen, the reverse-trapezoid shape having an included angle α at its bottom side that is ranged from 90° to 180°.

2. The touch screen as claimed in claim 1, wherein the touch-controlling electrode has a thickness smaller than or equal to a thickness of the insulating layer and an upper surface of the touch-controlling electrode is flush with an upper surface of the insulating layer.

3. The touch screen as claimed in claim 2, wherein the thickness of the touch-controlling electrode is in a range from 500 Å to 2,000 Å.

4. The touch screen as claimed in claim 1, wherein the touch-controlling electrode is made of a transparent conductive material, and the transparent conductive material includes tin indium oxide.

5. The touch screen as claimed in claim 1, wherein the insulating layer is made of a transparent insulation material which includes an organic resin material; or, the insulating layer is made of transparent glass.

6. A display panel comprising a display screen, wherein the display panel further comprises the touch screen as claimed in claim 1, the touch screen being disposed at a displaying side of the display screen.

7. A display device comprising the display panel as claimed in claim 6.

8. A method of manufacturing a touch screen, comprising steps of:
forming an insulating layer and a touch-controlling electrode;
wherein, the step of forming an insulating layer and a touch-controlling electrode comprises:
forming at least one recess structure in a side of the insulating layer; and
forming the touch-controlling electrode in the at least one recess structure;
wherein a cross section area of the touch-controlling electrode taken in a direction perpendicular to a touch face of the touch screen is larger at a position corresponding to the top of the at least one recess structure than at a position corresponding to the bottom of the at least one recess structure,
wherein the touch-controlling electrode has a cross section in a reverse-trapezoid shape in the direction perpendicular to the touch face of the touch screen, the reverse-trapezoid shape having an included angle α at its bottom side that is ranged from 90° to 180°.

9. The method as claimed in claim 8, wherein the method comprises:
forming the insulating layer, and forming the at least one recess structure in the insulating layer through a patterning process;
forming a film of electrically conductive layer on the insulating layer having the at least one recess structure;
forming a photoresist layer on the film of electrically conductive layer and performing a patterning process on the photoresist layer such that a portion of the photoresist layer located in a region corresponding to the recess structure is remained;
performing a patterning process on the film of electrically conductive layer such that a portion of the film of electrically conductive layer located in the recess structure is remained so as to form the touch-controlling electrode.

10. The method as claimed in claim 9, wherein the insulating layer is made of a transparent insulation material which includes organic resin material.

11. The method as claimed in claim 9, wherein the film of electrically conductive layer is made of a transparent conductive material, which includes tin indium oxide.

12. The method as claimed in claim 8, wherein the touch screen is formed on a substrate of a display screen, the method comprises:
forming a photoresist layer on an upper surface of the substrate, and removing, through a patterning process, a portion of the photoresist layer in a region corresponding to the touch-controlling electrode to be formed;
forming the recess structure in a region of the substrate where no photoresist layer covers through a patterning process;
forming a film of electrically conductive layer over the substrate having the at least one recess structure;
peeling off residue portions of the photoresist layer left on the substrate and a portion of the film of electrically conductive layer located on the photoresist layer through an ashing process such that a portion of the film of electrically conductive layer in the recess structure is remained so as to form the touch-controlling electrode.

13. The method as claimed in claim 12, wherein the substrate is provided thereon with the insulating layer in advance, and then the photoresist layer is formed on the insulating layer, and finally the touch-controlling electrode is formed in the insulating layer.

14. The method as claimed in claim 8, wherein the touch-controlling electrode has a cross section in a reverse-trapezoid shape in the direction perpendicular to the touch face of the touch screen, the reverse-trapezoid shape having an included angle α at its bottom side that is ranged from 90° to 180°.

15. The method as claimed in claim 8, wherein the touch-controlling electrode has a thickness smaller than or equal to a thickness of the insulating layer and an upper surface of the touch-controlling electrode is flush with an upper surface of the insulating layer.

16. The method as claimed in claim 15, wherein the thickness of the touch-controlling electrode is in a range from 500 Å to 2,000 Å.

* * * * *